US010838299B2

(12) United States Patent
Valentine et al.

(10) Patent No.: US 10,838,299 B2
(45) Date of Patent: Nov. 17, 2020

(54) LIGHT SOURCE WITH PLURALITY OF WAVEGUIDES

(71) Applicant: Facebook Technologies, LLC, Menlo Park, CA (US)

(72) Inventors: Gareth John Valentine, Redmond, WA (US); James Ronald Bonar, Redmond, WA (US)

(73) Assignee: Facebook Technologies, LLC, Menlo Park, CA (US)

( * ) Notice: Subject to any disclaimer, the term of this patent is extended or adjusted under 35 U.S.C. 154(b) by 0 days.

(21) Appl. No.: 16/736,198

(22) Filed: Jan. 7, 2020

(65) Prior Publication Data

US 2020/0142298 A1    May 7, 2020

Related U.S. Application Data

(63) Continuation of application No. 16/000,253, filed on Jun. 5, 2018, now Pat. No. 10,585,351.

(51) Int. Cl.
*G03F 7/00* (2006.01)
*G02B 6/34* (2006.01)
*G02B 6/30* (2006.01)
*G02B 6/28* (2006.01)
*G02B 6/13* (2006.01)
*G02F 1/335* (2006.01)

(52) U.S. Cl.
CPC ............. *G03F 7/001* (2013.01); *G02B 6/30* (2013.01); *G02B 6/34* (2013.01); *G02B 6/13* (2013.01); *G02B 6/2821* (2013.01); *G02F 1/335* (2013.01)

(58) Field of Classification Search
None
See application file for complete search history.

(56) References Cited

U.S. PATENT DOCUMENTS

2018/0210146 A1*  7/2018  Klug .................. G02B 27/0172

* cited by examiner

*Primary Examiner* — Jerry Rahll
(74) *Attorney, Agent, or Firm* — Freestone Intellectual Property Law PLLC; Aaron J. Visbeek (57) ABSTRACT

A first waveguide emits first light and a second waveguide emits second light. A filter is configured to reflect the second light and pass the first light to an entrance facet of the second waveguide.

20 Claims, 7 Drawing Sheets

LIGHT SOURCE WITH PLURALITY OF WAVEGUIDES

CROSS REFERENCE TO RELATED APPLICATIONS

This application claims priority to U.S. non-provisional application Ser. No. 16/000,253 filed Jun. 5, 2018, which is hereby incorporated by reference.

TECHNICAL FIELD

This disclosure relates generally to semiconductors, and in particular to light sources.

BACKGROUND INFORMATION

Light sources have traditionally included incandescent bulbs, halogen bulbs, cold-cathode-fluorescents (CCFLs), lasers, light emitting diodes (LEDs), and superluminescent LEDs (SLEDs), among others. Different lights sources are usually selected for different applications. Light sources for illuminating displays have included CCFLs, white LEDs, red-green-blue (RGB) LEDs, and others. Often, it is desirable for a light source for a display to be able to reproduce all or most of the color gamut visible to the human eye. For light sources that are incorporated into displays of electronics, cost, size, power efficiency, color spectrum, spatial coherence, temporal coherence, brightness, and life-span may all be considered in the design.

BRIEF DESCRIPTION OF THE DRAWINGS

Non-limiting and non-exhaustive embodiments of the invention are described with reference to the following figures, wherein like reference numerals refer to like parts throughout the various views unless otherwise specified.

DETAILED DESCRIPTION

Embodiments of a system and device comprising a colinear light source including active optical waveguides are described herein. In the following description, numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The systems and devices described in this disclosure include a colinear light source including coupled active optical waveguides. In certain contexts, it is desirable for a light source to be small, high intensity, and/or colinear. The spectral bandwidth, temporal coherence, and spatial coherence of illumination light generated by the light source may also be important for light sources, depending on the application. In embodiments of this disclosure, active optical waveguides are coupled together so that the light from each of the active optical waveguides is emitted from a single facet or from facets spaced very close together. The illumination light emitting from the facet(s) may be colinear. Coupling the active optical waveguides to achieve the colinear illumination light may keep the light source small and light. In a particular illustrated example, the active optical waveguides are red, green, and blue edge-emitting superluminescent light emitting diodes (SLEDs) and the red, green, and blue light is mixed together to provide a white illumination light. SLEDs provide high brightness light with relatively narrow spectral bandwidth without the temporal coherence of lasers, which can be advantageous in some optical systems. In other examples of the disclosure, laser light may be preferable and laser diodes may be used as the active optical waveguides in the disclosure. Edge emitting LEDs may also utilize the designs and techniques of this disclosure. These and other embodiments are described in more detail below with respect to FIGS. 1A-7.

Figure 1A:
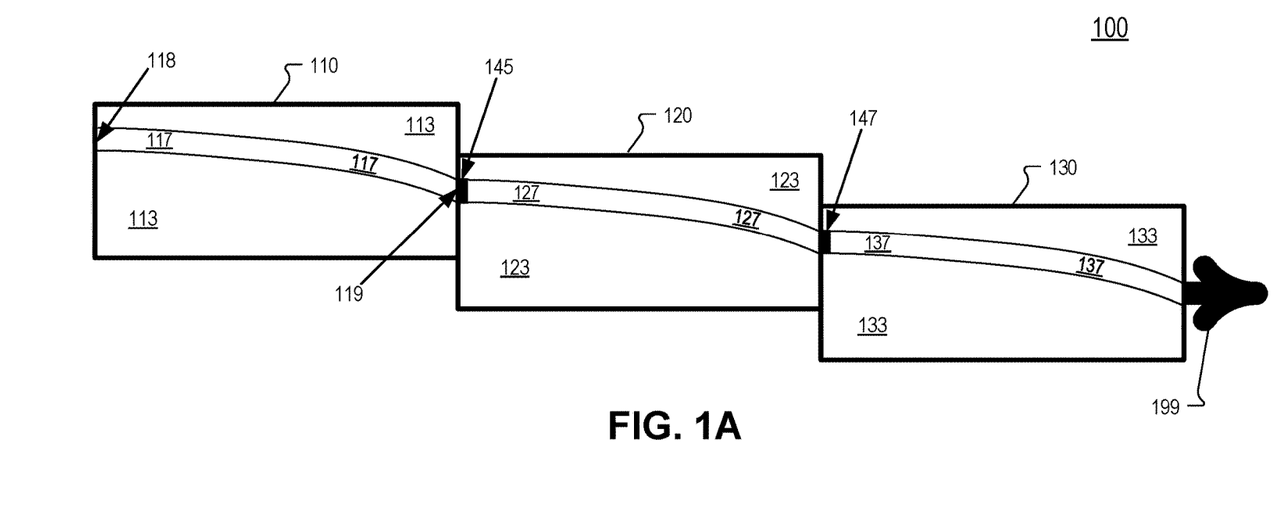
FIGS. 1A and 1B illustrate example devices having waveguides of superluminescent light emitting diodes (SLEDs) coupled together to generate a light source, in accordance with an embodiment of the disclosure.
Figure 1B:
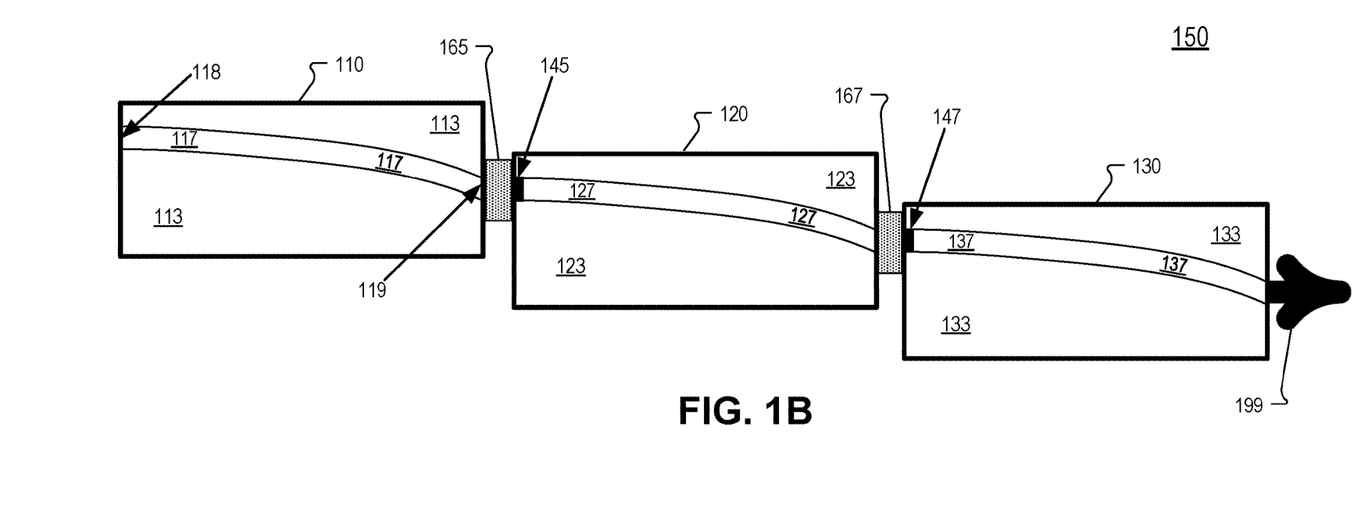

FIGS. 1A and 1B illustrate example devices having active optical waveguides optically coupled together to generate a colinear light source, in accordance with an embodiment of the disclosure. Embodiments of the disclosure may describe SLEDs for illustration purposes, although those skilled in the art appreciate that the designs of the example embodiments may apply to devices/chips other than SLEDs that have active optical waveguides. Examples of devices that utilize active optical waveguides to emit light includes SLEDs, LEDs, lasers, and laser diodes, for example. In the illustrated embodiment of FIG. 1A, device 100 includes a red SLED 110, a green SLED 120, and a blue SLED 130. In other embodiments, different SLED colors may be used. SLEDs 110, 120, and 130 may be edge emitting SLEDs.

Red SLED 110 includes a waveguide 117 formed in a semiconductor material 113 that is configured to emit red light when red SLED 110 is driven by an electrical current. Green SLED 120 includes a waveguide 127 formed in a semiconductor material 123 that is configured to emit green light when green SLED 120 is driven by an electrical current. Blue SLED 130 includes a waveguide 137 formed in a semiconductor material 133 (e.g. gallium nitride) that is configured to emit blue light when blue SLED 130 is driven by an electrical current. In FIG. 1A, waveguides 117, 127, and 137 are curved waveguides. Curved waveguides may be utilized in SLEDs to suppress recirculation of the emitted light and hence prevent laser oscillation.

Waveguide 117 includes an exit facet 119 and an opposing facet 118 on an opposite end of waveguide 117. Waveguides 127 and 137 also include exit facets and opposing facets similar to waveguide 117, but they are not specifically illustrated. As red SLED 110 is driven, the generated red light propagates along waveguide 117. Opposing facet 118 may be coated with a highly reflecting multilayer dielectric coating to confine the red light to waveguide 117 and enable a "double pass" of the red light within waveguide 117. In one embodiment, the exit facet 119 is coated with a low reflectivity dielectric coating to achieve negligible optical feedback of the red light into the waveguide and hence suppressing laser oscillation. The exit facet 119 of red SLED 110 is optically coupled to the waveguide 127 of green SLED 120 so that the red light propagating in waveguide 117 is coupled into green SLED 120. A dichroic filter 145 is disposed between waveguide 117 and waveguide 127 and the dichroic filter 145 is configured to reflect green light propagating in waveguide 127 while passing the red light propagating in waveguide 117. In one embodiment, exit facet 119 is coated with the dichroic filter 145. In another embodiment, the entrance facet of the green waveguide 127 is coated with the dichroic filter. By having dichroic filter 145 be highly transmissive (i.e. >95%) to red light and highly reflective (i.e. >95% reflectivity) for green light, the red light is allowed to combine with green light generated by green SLED 120 while also confining the green light to waveguide 127.

As green SLED 120 is driven, the generated green light propagates along waveguide 127. In an embodiment, the exit facet of the green waveguide 127 is antireflection coated for both the red and green wavelengths to suppress green laser oscillation within the waveguide and optimize red light transmission. The exit facet of the green waveguide 127 is optically coupled to waveguide 137 so that the green light and the red light propagating in waveguide 127 are coupled into the blue SLED 130. A second dichroic filter 147 is disposed between waveguide 127 and waveguide 137 and the dichroic filter 147 is configured to reflect blue light propagating in waveguide 137 while passing the red light and green light propagating in waveguide 127. In one embodiment, the exit facet of green SLED 120 is coated with the dichroic filter 147. In another embodiment, the entrance facet of blue SLED 130 is coated with the dichroic filter 147. By having dichroic filter 147 be highly transmissive (i.e. >95%) to red light and green light and highly reflective (i.e. >95% reflectivity) for blue light, the red light and green light are allowed to combine with blue light generated by blue SLED 130 while also confining the blue light to waveguide 137. As a result, the red, green, and blue light all propagate (and mix) within waveguide 137 and are ultimately emitted as colinear white illumination light 199 through the exit facet of the blue SLED 130. Since white illumination light 199 includes red, green, and blue light, device 100 may be considered a full-color light source. The exit facet of the red waveguide 137 may have a low reflectivity coating for all three colors, red, green and blue to optimize light output coupling. This exit facet may have particularly low reflectivity for the red light to suppress red laser oscillation within the waveguide 137.

While device 100 is described as being capable of generating colinear white illumination light 199, each SLED 110, 120, and 130 may also be individually driven so that illumination light 199 may be selected to be essentially any color within a wide color gamut. In embodiments of the disclosure, SLED 110 is driven with a driving circuit that controls the driving current of SLED 110. SLED 110 may also be driven with a driving circuit that drives SLED 110 with a set current that is pulse-width modulated (PWM) to modulate the overall light output of SLED 110. SLED 110 may also be driven with a driving circuit that allows for both current control and PWM control. The driving circuit for SLED 110 may allow a dimming ratio of 1,000:1 or better. SLED 120 and SLED 130 may be driven with similar driving circuits. Consequently, by selectively driving SLEDs 110, 120, and 130, essentially any color can be generated as colinear illumination light 199. Advantageously, the colinear illumination light 199 is emitted such that the optical axis of any emitted red, green, and blue light is substantially aligned and the red, green, and blue light does not require a "mixing distance" because any mixing of the RGB light has already occurred in the waveguides of device 100 before the light exits the exit facet of the device as colinear illumination light 199. Devices 150, 200, 300, 400, 500, and 600 of this disclosure described below may also be driven with the driving circuits described in this paragraph to achieve similar results. These implementations of colinear RGB light sources that can be independently modulated to emit essentially any color of light allows for scanned 2D images to be generated. This technology may be used in projection systems, including pico-projectors and projectors included in Head Mounted Displays (HMDs).

In the embodiment of FIG. 1A, the red SLED 110, the green SLED 120, and the blue SLED 130 are arranged so that the wavelength of light generated by each SLED is below the bandgap of the semiconductor material of the SLED that the light is coupled into. For example, the red light generated by red SLED 110 may emit a wavelength having a photon energy below the bandgap of semiconductor materials 123 and 133 and the green light generated by green SLED 120 may have a wavelength having a photon energy below the bandgap of semiconductor material 133. This arrangement may reduce absorption of the coupled light within the waveguides. In embodiments of the disclosure, the waveguides may be optically coupled through direct waveguide match, index matching, or using a lens to incouple light from waveguide into the other. In some embodiments, the waveguides may have different f-numbers associated with their facets, however, there will be little (if any optical loss) as long as the facet of the waveguide receiving the light accepts the full f-number of the waveguide that is providing the light.

FIG. 1B illustrates device 150 including red SLED 110, green SLED 120, and blue SLED 130. Device 150 is similar to device 100 although device 150 includes an index matching material 165 disposed between waveguide 117 and waveguide 127 and an index matching material 167 disposed between waveguide 127 and waveguide 137. The index matching material is configured to facilitate efficient light coupling between the waveguides. In one embodiment, the index matching materials 165 and 167 include an adhesive to adhere red SLED 110 to green SLED 120 and adhere green SLED 120 to blue SLED 130. Although not specifically illustrated, an index matching material (including an adhesive index matching material) may be utilized between the coupled waveguides in the other embodiments of the disclosure.

Figure 2:
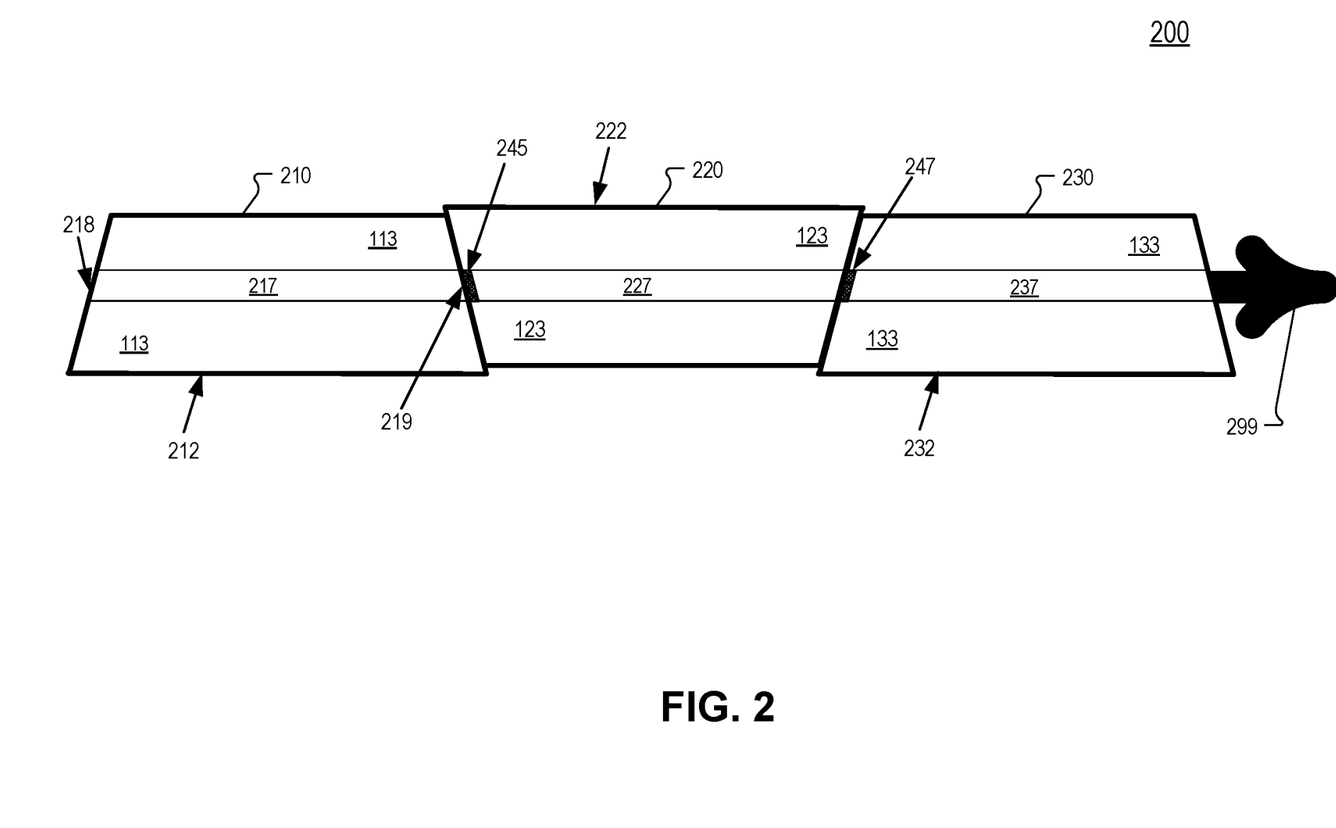
FIG. 2 illustrates an example device having waveguides of trapezoidal cut SLEDs coupled together to generate a light source, in accordance with an embodiment of the disclosure.

FIG. 2 illustrates an example device 200, in accordance with an embodiment of the disclosure. Example device 200 includes a red SLED 210, a green SLED 220, and a blue SLED 230. In other embodiments, different SLED colors may be used. In FIG. 2, SLEDs 210, 220, and 230 are trapezoidal cut edge emitting SLEDs. SLEDs may also be cut at an angle in the plane of the device to provide low reflection, in some embodiments.

Red SLED 210 includes a waveguide 217 formed in a semiconductor material 113 that is configured to emit red light when red SLED 210 is driven by an electrical current. Green SLED 220 includes a waveguide 227 formed in a semiconductor material 123 that is configured to emit green light when green SLED 220 is driven by an electrical current. Blue SLED 230 includes a waveguide 237 formed in a semiconductor material 133 that is configured to emit blue light when blue SLED 230 is driven by an electrical current. In FIG. 2, waveguides 217, 227, and 237 are straight waveguides with the facets at the ends of the waveguides cut at an angle, which may suppress optical feedback and facilitate coupling between waveguides. In red SLED 210, for example, the exit facet 219 is angled and the opposing facet 218 is also angled. Green SLED 220 and blue SLED 230 also include angled exit facets and opposing facets, although they are not specifically numbered.

In the embodiment of FIG. 2, the trapezoid shape of SLED 210 and 230 are oriented similarly while the trapezoid shape of SLED 220 is inverted so that its angled exit facet is coupled to the angled opposing facet of SLED 230 to facilitate optical coupling between waveguides 227 and 237. The angled opposing facet of SLED 220 is also coupled to the angled exit facet 219 of SLED 210 to facilitate optical coupling between waveguides 217 and 227. Because of the inverted trapezoid arrangement of FIG. 2, the longest edge of the red SLED 210 and the blue SLED 230 are disposed opposite from the longest edge of the green SLED 220, in the illustrated embodiment.

Device 200 includes dichroic filters 245 and 247 which are configured similarly to dichroic filters 145 and 147. In operation, device 200 generates red light in waveguide 217 with red SLED 210 and the red light passes through dichroic filter 245 and is coupled into waveguide 227. The green light in waveguide 227 generated by green SLED 220 reflects off of dichroic filter 245 and mixes with the incoupled red light. The red light and the green light propagating in waveguide 227 pass through dichroic filter 247 and are coupled into waveguide 237. The blue light in waveguide 237 generated by blue SLED 230 reflects off of dichroic filter 247 and mixes with the incoupled red and green light and is ultimately emitted as colinear white illumination light 299 through the exit facet of the blue SLED 230. In one embodiment, all dichroic filters are thin film multistack dielectric coatings on the facets of the devices 210, 220 and 230.

Figure 3:
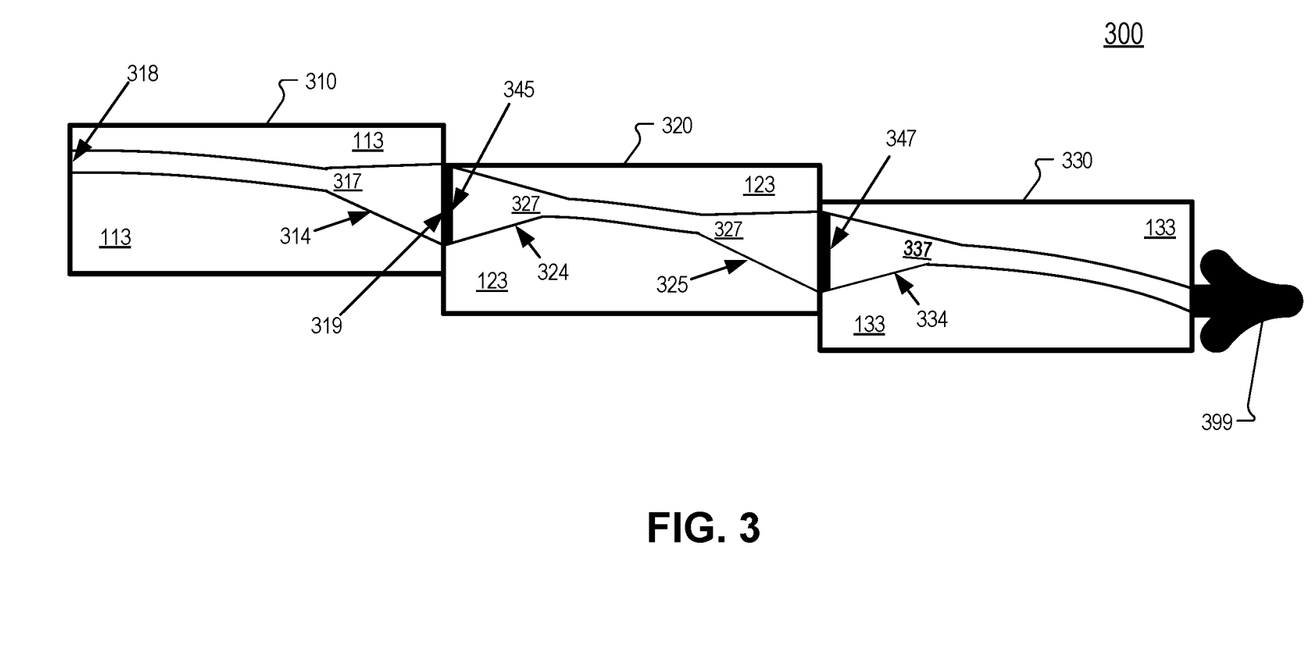
FIG. 3 illustrates an example device having tapered waveguides of SLEDs coupled together to generate a light source, in accordance with an embodiment of the disclosure.

FIG. 3 illustrates an example device 300, in accordance with an embodiment of the disclosure. Example device 300 includes a red SLED 310, a green SLED 320, and a blue SLED 330. In other embodiments, different SLED colors may be used. In FIG. 3, SLEDs 310, 320, and 330 have tapered waveguides.

Red SLED 310 includes a waveguide 317 formed in a semiconductor material 113 that is configured to emit red light when red SLED 310 is driven by an electrical current. The exit end (closest to exit facet 319) of waveguide 317 includes a broadening taper 314. Taper 314 flares outward which may increase the gain area of red SLED 310. Green SLED 320 includes a waveguide 327 formed in a semiconductor material 123 that is configured to emit green light when green SLED 320 is driven by an electrical current. The exit end of waveguide 327 includes a broadening taper 325 and the receiving end of waveguide 327 includes a broadening taper 324. Tapers 324 and 325 may enhance optical coupling and also improve performance (brightness) of the green SLED 320, which typically have lower gain than red and blue SLEDs. Blue SLED 330 includes a waveguide 337 formed in a semiconductor material 133 that is configured to emit blue light when blue SLED 330 is driven by an electrical current. The receiving end of waveguide 337 includes a broadening taper 334. The broadening tapers 314, 324, 325, and 334 may suppress optical feedback between waveguides and suppress lasing behavior in the light propagating in the waveguides 317, 327, 337.

Device 300 includes dichroic filters 345 and 347 which are configured similarly to dichroic filters 145 and 147. In operation, device 300 generates red light in waveguide 317 with red SLED 310 and the red light passes through dichroic filter 345 and is coupled into waveguide 327. The green light in waveguide 327 generated by green SLED 320 reflects off of dichroic filter 345 and mixes with the incoupled red light. The red light and the green light propagating in waveguide 327 pass through dichroic filter 347 and are coupled into waveguide 337. The blue light in waveguide 337 generated by blue SLED 330 reflects off of dichroic filter 347 and mixes with the incoupled red and green light and is ultimately emitted as colinear white illumination light 399 through the exit facet of the blue SLED 330. In one embodiment, all dichroic filters are thin film multistack dielectric coatings on the facets of the devices 310, 320 and 330.

In some embodiments of FIGS. 1A-3, two active optical waveguides may be used to generate a colinear light source with selectable color. For example, the exit facet of the green waveguide 127 may emit a colinear light that includes the red light from active optical waveguide 117 and the green light generated by active optical waveguide 127. The colinear light may be tuned (by modulating the light output of SLEDs 110 and 120) to colors within the color gamut provided by the red light and green light.

Figure 4:
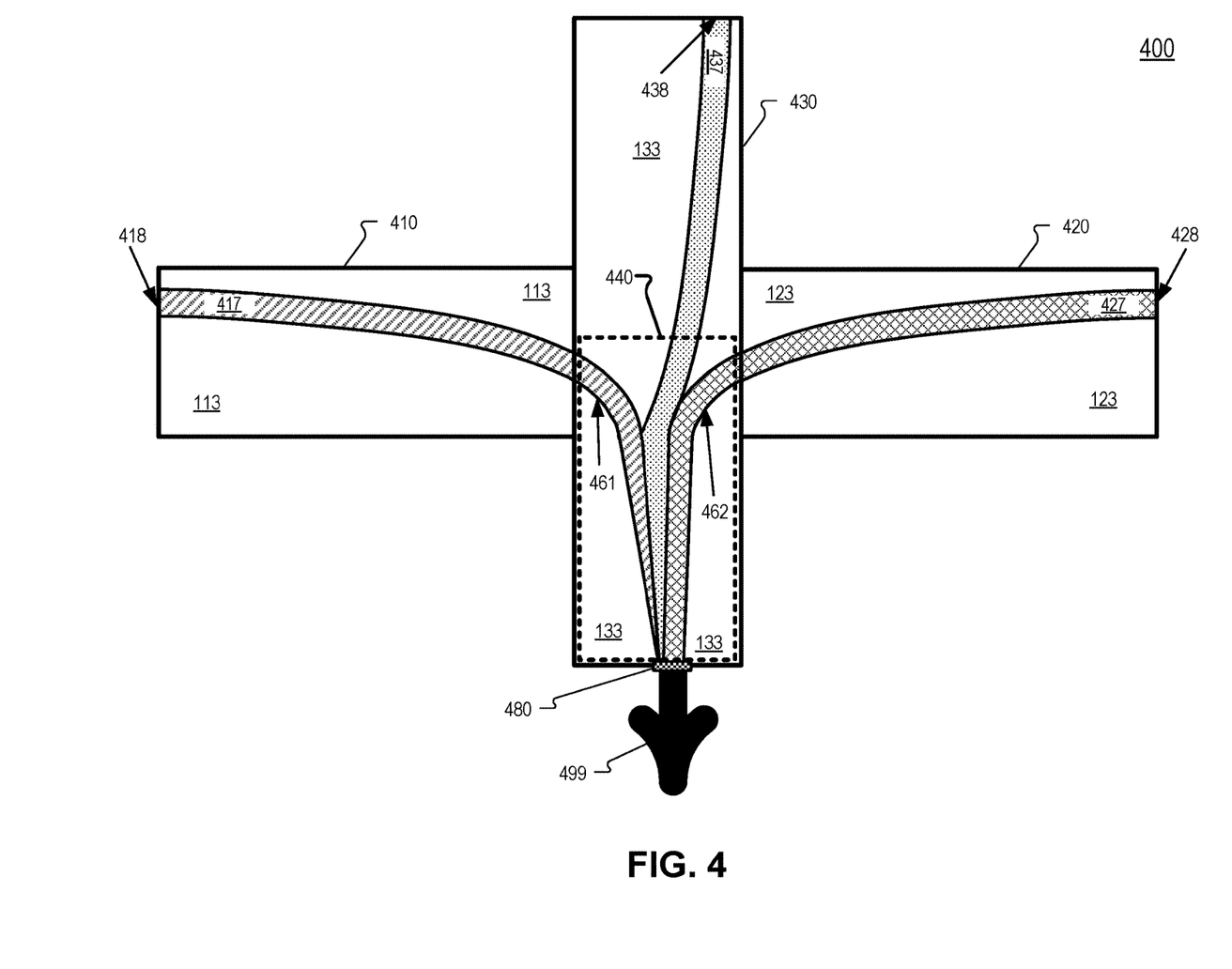
FIG. 4 illustrates an example device including three active optical waveguides emitting three different spectrums of light and an exit facet coupled to emit illumination light including the three different spectrums of light, in accordance with an embodiment of the disclosure.

FIG. 4 illustrates an example device 400 including active optical waveguide emitting three different spectrums of light and an exit facet coupled to emit illumination light including the three different spectrums of light, in accordance with an embodiment of the disclosure. In the illustrated embodiment of FIG. 4, device 400 includes a red SLED 410, a green SLED 420, and a blue SLED 430. In other embodiments, different SLED colors may be used. SLEDs 410, 420, and 430 may be edge emitting SLEDs.

Red SLED 410 includes a waveguide 417 formed in a semiconductor material 113 that is configured to emit red light when red SLED 410 is driven by an electrical current. A highly reflective coating 418 is disposed at an end of waveguide 417. Green SLED 420 includes a waveguide 427 formed in a semiconductor material 123 that is configured to emit green light when green SLED 420 is driven by an electrical current. A highly reflective coating 428 is disposed at an end of waveguide 427. Blue SLED 430 includes a waveguide 437 formed in a semiconductor material 433 that is configured to emit blue light when blue SLED 430 is driven by an electrical current. A highly reflective coating 438 is disposed at an end of waveguide 437. In FIG. 4, an entirety of a combining waveguide 440 is formed in the semiconductor material 133 of blue SLED 430. Combining waveguide 440 is configured to receive the red light from waveguide 417, the green light from waveguide 427, and the blue light from waveguide 437. Combining waveguide 440 is configured to direct the red light, green light, and blue light to exit facet 480 for emission as colinear white illumination light 499. Semiconductor material 133 may have a bandgap energy above the photon energies of the red light received from waveguide 417 and the green light received from waveguide 427.

In the illustrated embodiment, combining waveguide 440 includes a first bending waveguide 461 butt-coupled to the waveguide 417 to receive the red light propagating in waveguide 417. Combining waveguide 440 also includes a second bending waveguide 462 butt-coupled to the waveguide 427 to receive the green light propagating in waveguide 427. The first bending waveguide 461 and the second bending waveguide 462 are configured to direct the red and green light, respectively, to exit facet 480 on an adjacent side of the blue SLED 430 with respect to where the light was received.

Bending waveguides 461 and 462 may include a ridged waveguide structure to accommodate a tight bending radii. In one embodiment, linear reflectors etched into the semiconductor material 133 may reflect the light to reflect the light ninety degrees. In one embodiment, a gradually increasing radius of curvature within bending waveguides 461 and/or 462 (e.g. based on Euler spirals) may reduce the optical losses within a ninety-degree bend of bending waveguides 461 and/or 462.

In operation, device 400 generates red light in waveguide 417 with red SLED 410. The red light may be reflected by the highly reflective coating 418 and be incoupled into bending waveguide 461. Green light is generated in waveguide 427 with green SLED 420. The green light may be reflected by the highly reflective coating 428 and be incoupled into bending waveguide 462. Blue light is generated in waveguide 437 with blue SLED 430. The blue light may be reflected by the highly reflective coating 438 and propagate toward exit facet 480 where it is combined with the red light in waveguide 461 and the green light in 462 as colinear white illumination light 499.

Figure 5:
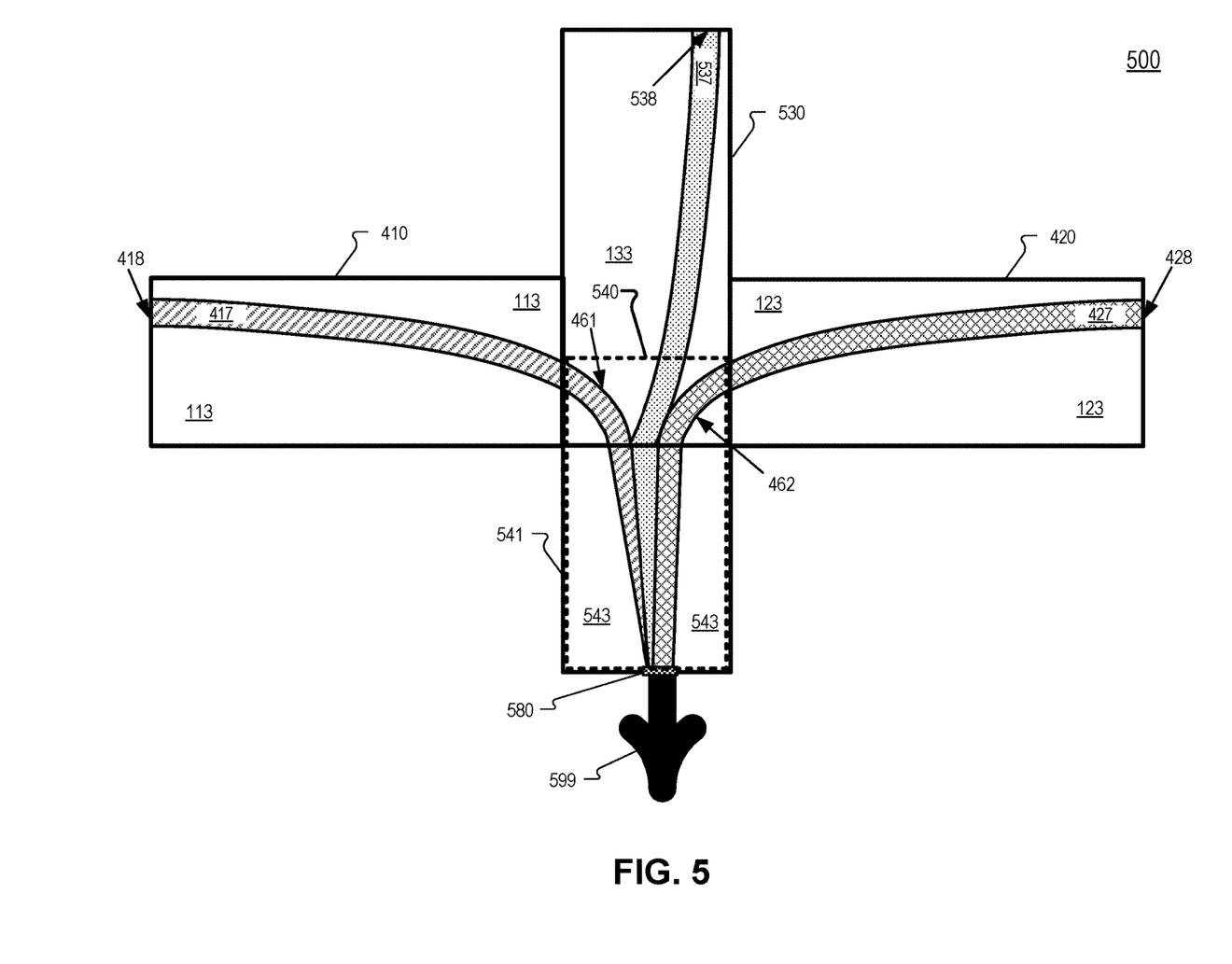
FIG. 5 illustrates an example device including a combining low loss passive waveguide coupled to receive and combine three different light spectrums for emitting as illumination light from an exit facet, in accordance with an embodiment of the disclosure.

FIG. 5 illustrates a device 500 that is similar to device 400 although an exit portion 541 of combining waveguide 540 is separate from blue SLED 530 instead of the entire combining waveguide 440 being formed in semiconductor material 133 of blue SLED 430, as in FIG. 4. In FIG. 5, the exit portion 541 (solid lines) of combining waveguide 540 (dashed lines) is made from semiconductor material 543. Semiconductor material 543 may be transparent to the red light, green light, and blue light received by combining waveguide 540. Semiconductor material 543 may include undoped gallium nitride, titanium dioxide, or sapphire, for example. In one embodiment, semiconductor material 543 is the same as semiconductor material 133. In FIG. 5, a portion of the combining waveguide 540 (including at least a portion of bending waveguide 461 and 462) is formed in semiconductor material 133 of blue SLED 530.

In operation, device 500 generates red light in waveguide 417 with red SLED 410. The red light may be reflected by the highly reflective coating 418 and be incoupled into bending waveguide 461. Green light is generated in waveguide 427 with green SLED 420. The green light may be reflected by the highly reflective coating 428 and be incoupled into bending waveguide 462. Blue light is generated in waveguide 537 with blue SLED 530. The blue light may be reflected by the highly reflective coating 538 and propagate toward exit facet 580 where it is combined with the red light in waveguide 461 and the green light in 462 as colinear white illumination light 599.

In some embodiments of the disclosure, edge emitting laser diodes or edge emitting LEDs may replace the SLEDs described in FIGS. 1A-5. In one embodiment, a green SLED or green laser diode is pumped with a blue SLED or blue laser diode. A highly reflective coating may be disposed on one end of the blue waveguide while a dichroic filter is disposed on another end of the blue waveguide that is coupled to the green SLED or green laser diode. The dichroic filter disposed on the end of the blue waveguide may pass blue light but be highly reflective to green light so that the blue light from the blue waveguide can propagate into the green waveguide of the green SLED or green laser diode. The exit facet of the green SLED will include a dichroic filter that emits the green light from the exit facet while reflecting the blue light propagating in the green waveguide.

Figure 6:
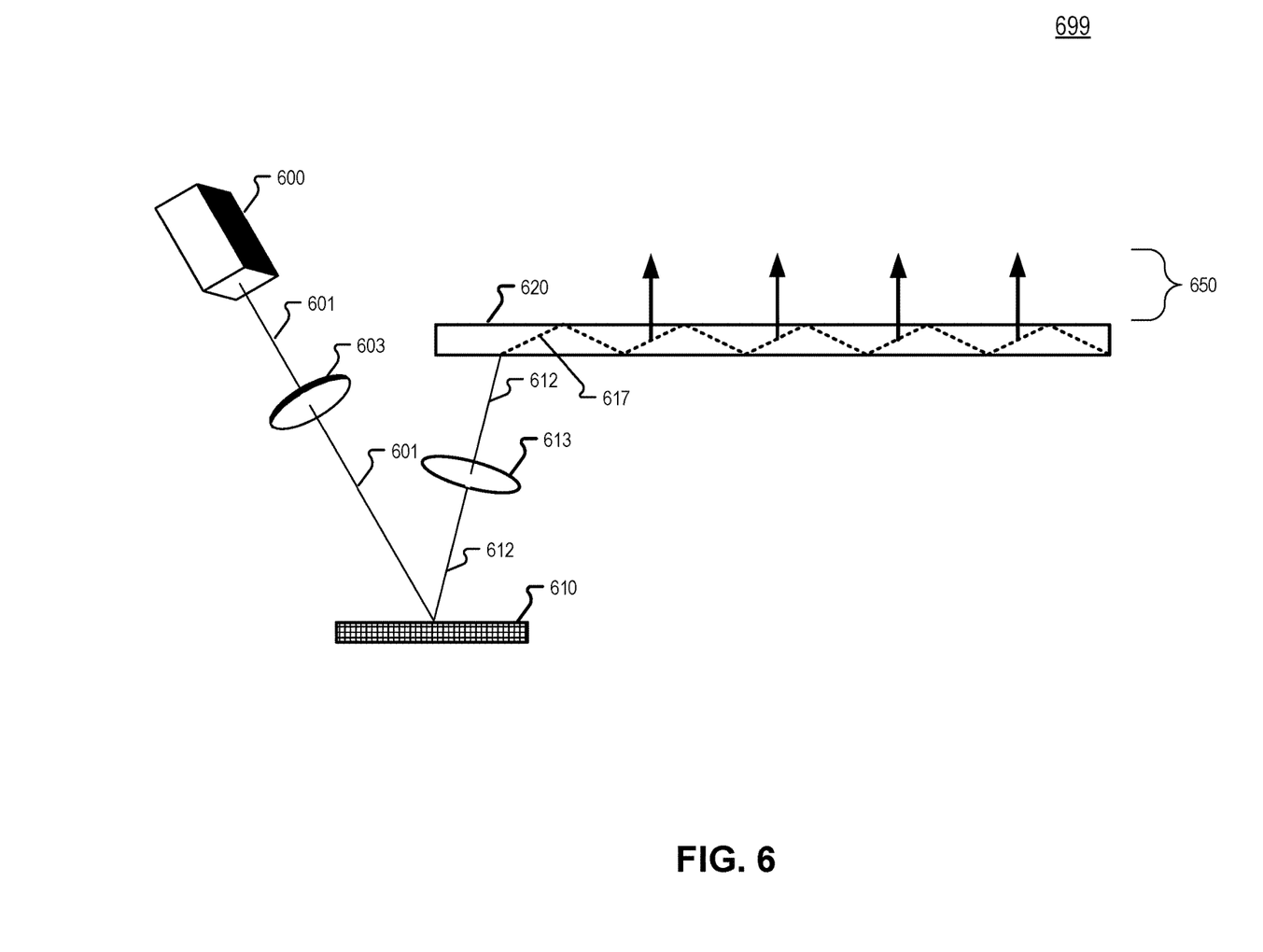
FIG. 6 illustrates an optical system including a light source, a focusing optic, and a display, in accordance with an embodiment of the disclosure.

FIG. 6 illustrates an optical system 699 including a light source 600, a focusing optic 603, and a display 610, in accordance with an embodiment of the disclosure. Optical system 699 further includes a collimating optic 613 and a near-to-eye waveguide 620. Light source 600 may include any of the devices 100, 200, 300, 400, or 500 of the disclosure. Light source 600 may emit illumination light 601 (e.g. 199, 299, 399, 499, or 599) to illuminate device 610. Focusing optic 603 may focus the illumination light 601 on device 610. Illumination light 601 may be raster scanned by device 610 as in a scanning display architecture to generate display light 612. In one embodiment (not illustrated), light source 600 is used as a backlight to a display device 610. In FIG. 6, display light 612 is collimated by collimating optic 613 and propagates to near-to-eye waveguide 620. Near-to-eye waveguide 620 may include an input grating that diffracts the display light 612 along optical path 617 until being outcoupled in an eyeward direction as image light 650. An output diffractive grating of near-to-eye waveguide 620 may facilitate outcoupling the display light 612 as image light 650.

Utilizing devices 100/200/300/400/500 in light source 600 allows for a compact, high brightness, and colinear full-color light source to illuminate a single or multiple MEMS 2D scanning device/devices. The individual color devices e.g. 110/120/130 etc. within device 100 etc. may be modulated in amplitude using current modulation and/or pulse-width modulation, as the MEMS device 610 raster scans a full 2D image. In this way, a full color image may be constructed during each full frame scan.

In another embodiment, including a device such as devices 100/200/300/400/500 in light source 600 allows for a compact, high brightness, and colinear full-color light source to illuminate display 610. The colinear nature of full-color illumination light 601 allows the illumination light to propagate through a central axis of focusing optic 603 (and other optics in the system) to illuminate display 610. Allowing the illumination light 601 to travel through the central axis of the optical system may reduce optical aberration and allow the optical system between light source 600 and display 610 to be smaller, simpler, lighter, and/or less costly.

Figure 7:
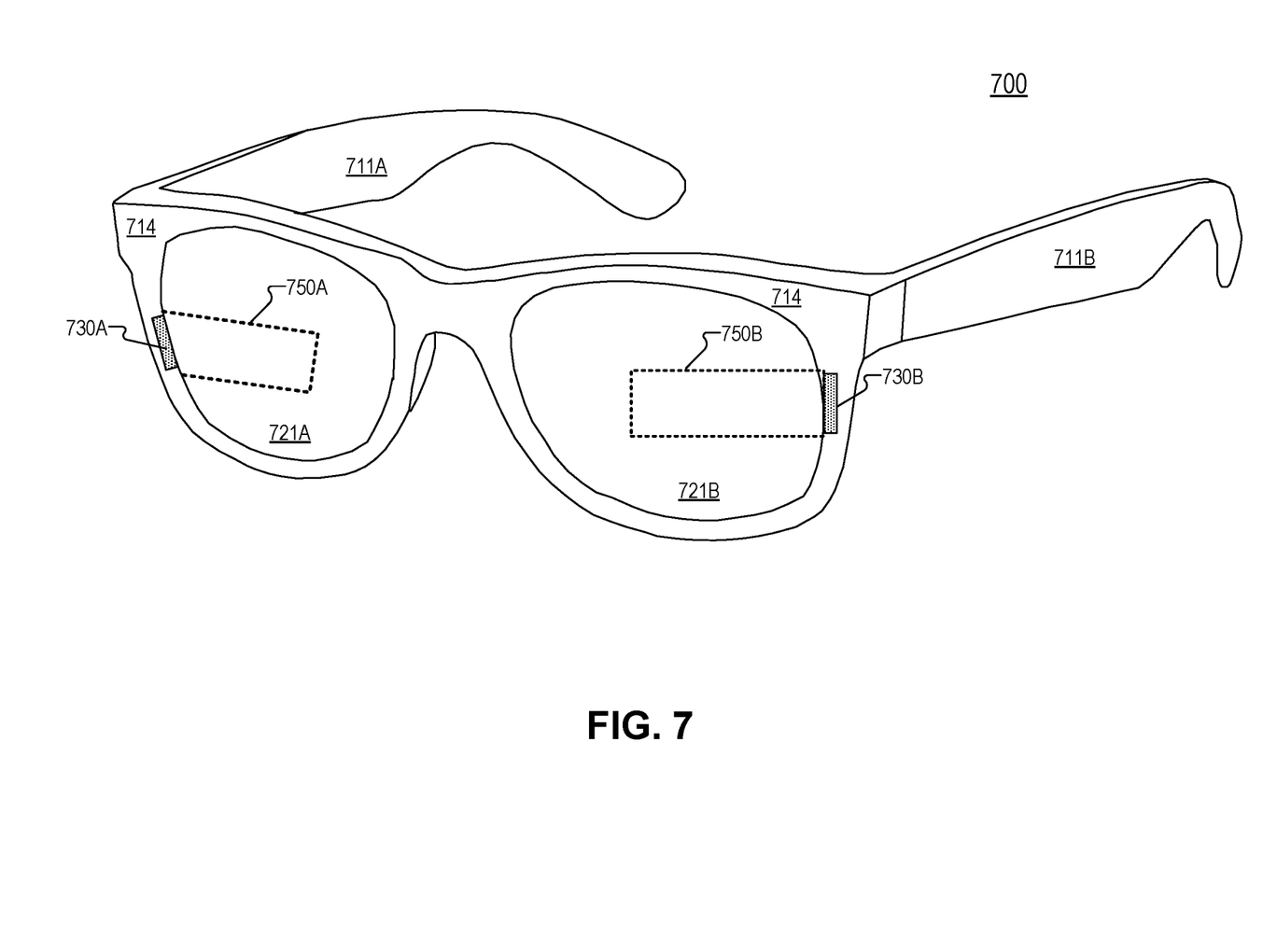
FIG. 7 illustrates an example Head Mounted Display that includes a display including a light source, in accordance with an embodiment of the disclosure.

FIG. 7 illustrates an example Head Mounted Display (HMD) 700 that devices 100/200/300/400/500 or optical system 699 may be incorporated into, in accordance with an embodiment of the disclosure. HMD 700 includes frame 714 coupled to arms 711A and 711B. Lenses 721A and 721B are mounted to frame 714. Lenses 721 may be prescription lenses matched to a particular wearer of HMD or non-prescription lenses. The illustrated HMD 700 is configured to be worn on or about a head of a user of the HMD.

In FIG. 7, each lens 721 includes a waveguide 750 to direct image light generated by a display 730 to an eyebox area for viewing by a wearer of HMD 700. Display 730 may include an LCD, a 2D scanning MEMS device, a 2D micromirror MEMS array, a sequence of spinning polygon mirrors, acousto-optic or electro-optic deflection devices, or liquid crystal on silicon (LCOS) display for directing image light to a wearer of HMD 700. Devices 100/200/300/400/500 may serve as the light source for display 730, which may include a display similar to device 610.

The frame 714 and arms 711 of the HMD 700 may include supporting hardware of HMD 700. HMD 700 may include any of processing logic, wired and/or wireless data interface for sending and receiving data, graphic processors, and one or more memories for storing data and computer-executable instructions. In one embodiment, HMD 700 may be configured to receive wired power. In one embodiment, HMD 700 is configured to be powered by one or more batteries. In one embodiment, HMD 700 may be configured to receive wired data including video data via a wired communication channel. In one embodiment, HMD 700 is configured to receive wireless data including video data via a wireless communication channel.

Lenses 721 may appear transparent to a user to facilitate augmented reality or mixed reality where a user can view scene light from the environment around her while also receiving image light directed to her eye(s) by waveguide(s) 750. In some embodiments, image light is only directed into one eye of the wearer of HMD 700. In an embodiment, both displays 730A and 730B are included to direct image light into waveguides 750A and 750B, respectively.

Embodiments of the invention may include or be implemented in conjunction with an artificial reality system. Artificial reality is a form of reality that has been adjusted in some manner before presentation to a user, which may include, e.g., a virtual reality (VR), an augmented reality (AR), a mixed reality (MR), a hybrid reality, or some combination and/or derivatives thereof. Artificial reality content may include completely generated content or generated content combined with captured (e.g., real-world) content. The artificial reality content may include video, audio, haptic feedback, or some combination thereof, and any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, e.g., create content in an artificial reality and/or are otherwise used in (e.g., perform activities in) an artificial reality. The artificial reality system that provides the artificial reality content may be implemented on various platforms, including a head-mounted display (HMD) connected to a host computer system, a standalone HMD, a mobile device or computing system, or any other hardware platform capable of providing artificial reality content to one or more viewers.

The term "processing logic" in this disclosure may include one or more processors, microprocessors, multi-core processors, Application-specific integrated circuits (ASIC), and/or Field Programmable Gate Arrays (FPGAs) to execute operations disclosed herein. In some embodiments, memories (not illustrated) are integrated into the processing logic to store instructions to execute operations and/or store data. Processing logic may also include analog or digital circuitry to perform the operations in accordance with embodiments of the disclosure.

A "memory" or "memories" described in this disclosure may include one or more volatile or non-volatile memory architectures. The "memory" or "memories" may be removable and non-removable media implemented in any method or technology for storage of information such as computer-readable instructions, data structures, program modules, or other data. Example memory technologies may include RAM, ROM, EEPROM, flash memory, CD-ROM, digital versatile disks (DVD), high-definition multimedia/data storage disks, or other optical storage, magnetic cassettes, magnetic tape, magnetic disk storage or other magnetic storage devices, or any other non-transmission medium that can be used to store information for access by a computing device.

Communication channels described in this disclosure may include or be routed through one or more wired or wireless communication utilizing IEEE 802.11 protocols, BlueTooth, SPI (Serial Peripheral Interface), I²C (Inter-Integrated Circuit), USB (Universal Serial Port), CAN (Controller Area Network), cellular data protocols (e.g. 3G, 4G, LTE, 5G), optical communication networks, Internet Service Providers (ISPs), a peer-to-peer network, a Local Area Network (LAN), a Wide Area Network (WAN), a public network (e.g. "the Internet"), a private network, a satellite network, or otherwise.

A computing device may include a desktop computer, a laptop computer, a tablet, a phablet, a smartphone, a feature phone, a server computer, or otherwise. A server computer may be located remotely in a data center or be stored locally.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. A light source comprising:
    a first active optical waveguide configured to emit a first light spectrum;
    a second active optical waveguide configured to emit a second light spectrum; and
    a dichroic filter disposed between the first active optical waveguide and the second active optical waveguide, wherein the dichroic filter is configured to reflect the second light spectrum and pass the first light spectrum to an entrance facet of the second active optical waveguide.

2. The light source of claim 1, wherein an exit facet of the second active optical waveguide emits colinear light that includes the first light spectrum and the second light spectrum.

3. The light source of claim 1 further comprising:
    a third active optical waveguide configured to emit a third light spectrum; and
    a second dichroic filter disposed between the second active optical waveguide and the third active optical waveguide, wherein the second dichroic filter is configured to reflect the third light spectrum and pass the first light spectrum and the second light spectrum from the second active optical waveguide to the third active optical waveguide.

4. The light source of claim 3, wherein the first light spectrum, the second light spectrum, and the third light spectrum exit through an exit facet of the third active optical waveguide, the exit facet disposed on an opposite end of the third active optical waveguide from the second dichroic filter.

5. The light source of claim 3 further comprising:
a first driver circuit to independently modulate a first brightness of the first light spectrum from the first active optical waveguide;
a second driver circuit to independently modulate a second brightness of the second light spectrum from the second active optical waveguide; and
a third driver circuit to independently modulate a third brightness of the third light spectrum from the third active optical waveguide, wherein the first, second, and third driver circuit facilitate a single multicolor programmable colinear light to be emitted from an exit facet of the third active optical waveguide.

6. The light source of claim 3, wherein a first wavelength of the first light spectrum has a first photon energy below a bandgap of a second semiconductor material of the second active optical waveguide and below a bandgap of a third semiconductor material of the third active optical waveguide, and wherein a second wavelength of the second light spectrum has a second photon energy below the bandgap of the third semiconductor material.

7. The light source of claim 3, wherein the first light spectrum is red light, the second light spectrum is green light, and the third light spectrum is blue light.

8. The light source of claim 1, wherein the first active optical waveguide is formed in a first semiconductor material, and wherein the second active optical waveguide formed in a second semiconductor material different from the first semiconductor material.

9. A light source comprising:
first emitting means for emitting a first light spectrum;
second emitting means for emitting a second light spectrum different from the first light spectrum; and
filtering means for reflecting the second light spectrum and passing the first light spectrum to an entrance facet of the second emitting means, wherein an exit facet of the second emitting means emits colinear light that includes the first light spectrum and the second light spectrum.

10. The light source of claim 9 further comprising:
third emitting means for emitting a third light spectrum; and
second filtering means for reflecting the third light spectrum and passing the first light spectrum and the second light spectrum from the second emitting means to the third emitting means.

11. The light source of claim 10, wherein the first light spectrum is red light, the second light spectrum is green light, and the third light spectrum is blue light.

12. A device comprising:
a red diode configured to emit red light in a first waveguide of the red diode;
a green diode configured to emit green light in a second waveguide of the green diode;
a blue diode configured to emit blue light in a third waveguide of the blue diode; and
a first dichroic filter disposed between the first waveguide and the second waveguide, wherein the first dichroic filter is configured to reflect the green light and pass the red light from the first waveguide to the second waveguide.

13. The device of claim 12, wherein an exit facet of the second waveguide emits colinear light that includes the red light and the green light.

14. The device of claim 12 further comprising:
a second dichroic filter disposed between the second waveguide and the third waveguide, wherein the second dichroic filter is configured to reflect the blue light and pass the red light and the green light from the second waveguide to the third waveguide.

15. The device of claim 14, wherein the red light, the green light, and the blue light exit through an exit facet of the blue diode, the exit facet disposed on an opposite end of the third waveguide from the second dichroic filter, wherein the red light, the green light, and the blue light combine into illumination light that exits the exit facet.

16. The device of claim 15 further comprising:
a display positioned to be illuminated by the illumination light.

17. The device of claim 16, wherein the display includes a two-dimensional (2D) scanning micro-electro-mechanical (MEMS) device.

18. The device of claim 14, wherein the first dichroic filter includes thin film multistack dielectric coatings.

19. The device of claim 12, wherein the red diode is a red superluminescent light-emitting diode (SLED), the green diode is a green SLED, and the blue diode is a blue SLED.

20. The device of claim 19, wherein at least one of the red SLED, the blue SLED, or the green SLED is an edge-emitting SLED.

* * * * *